United States Patent
Akiyama et al.

(10) Patent No.: US 6,611,051 B2
(45) Date of Patent: Aug. 26, 2003

(54) SEMICONDUCTOR DEVICE AND COMMUNICATION TERMINAL USING THEREOF

(75) Inventors: Noboru Akiyama, Hitachinaka (JP); Minehiro Nemoto, Hitachi (JP); Seigou Yukutake, Hitachinaka (JP); Yasuyuki Kojima, Hitachi (JP); Kazuyuki Kamegaki, Tamamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/964,813

(22) Filed: Sep. 28, 2001

(65) Prior Publication Data

US 2002/0125555 A1 Sep. 12, 2002

(30) Foreign Application Priority Data

Mar. 8, 2001 (JP) ........................................ 2001-064319

(51) Int. Cl.⁷ ...................... H01L 23/02; H01L 23/28; H01L 22/16; H01L 23/34; H05K 7/02
(52) U.S. Cl. ................... 257/685; 257/686; 257/723; 257/730; 257/666; 257/676; 257/728; 257/777; 257/778; 257/528; 257/532; 257/355; 257/357; 257/724; 257/693; 257/203; 361/777; 361/736
(58) Field of Search ................................ 257/685, 686, 257/723, 724, 725, 728, 778, 777, 784, 786, 787, 528, 532, 357, 355, 691, 203, 666, 676; 361/777, 736

(56) References Cited

U.S. PATENT DOCUMENTS

| | | | | |
|---|---|---|---|---|
| 5,083,189 A | * | 1/1992 | Sawaya | |
| 5,490,041 A | * | 2/1996 | Furukawa et al. | 257/686 |
| 5,531,002 A | * | 7/1996 | Okada | 29/25.41 |
| 5,654,984 A | * | 8/1997 | Hershbarger et al. | 375/257 |
| 6,014,586 A | * | 1/2000 | Weinberg et al. | 257/686 |
| 6,043,109 A | * | 3/2000 | Yang et al. | 257/723 |
| 6,064,116 A | * | 5/2000 | Akram | 257/723 |
| 6,121,681 A | * | 9/2000 | Tanaka et al. | 257/723 |
| 6,198,136 B1 | * | 3/2001 | Voldman et al. | 257/357 |
| 6,239,366 B1 | * | 5/2001 | Hsuan et al. | 257/777 |
| 2001/0001504 A1 | * | 5/2001 | Sugiyama et al. | 257/666 |
| 2002/0020915 A1 | * | 2/2002 | Fujio et al. | 257/724 |

FOREIGN PATENT DOCUMENTS

JP  A-7-307708  11/1995

OTHER PUBLICATIONS

U.S. patent application Ser. No. 09/402,148, Kojima et al., filed Mar. 30, 1998.
U.S. patent application Ser. No. 09/466,846, Nemoto et al., filed Dec. 29, 1999.
U.S. patent application Ser. No. 09/259,058, Yukutake et al., filed Feb. 26, 1999.
Electronic Design, Tech Insights, "Two–Chip Modem Delivers Low–Cost Remote Access" Dave Bursky, Aug. 9, 1999, pp. 39–40.
PESC '98, IEEE Power Electronics Specification Conference, "Isolated Capacitively Coupled MOS Driver Circuit with Bidirectional Signal Transfer" pp. 1208–1213, 1998.

* cited by examiner

Primary Examiner—Alexander O. Williams
(74) Attorney, Agent, or Firm—Antonelli, Terry, Stout & Kraus, LLP

(57) ABSTRACT

Wire bonding or printed wiring board leads or, alternatively, lead frames or equivalents thereof are used to electrically connect external electrodes of high withstand voltage capacitors formed on a plurality of semiconductor chips. A driver circuit for signal transmission or receiver circuit for signal receipt formed on the semiconductor chips are electrically connected with substrate-side electrodes of said high withstand voltage capacitors, causing the plurality of semiconductor chips to be received within either a single package or a single module. Using this arrangement, a semiconductor device is capable of achieving both dielectricity and size reduction.

8 Claims, 11 Drawing Sheets

SEMICONDUCTOR DEVICE AND COMMUNICATION TERMINAL USING THEREOF

BACKGROUND OF THE INVENTION

The present invention relates to semiconductor devices of multiple-chip configuration having capacitive insulation means for electrical separation and isolation between primary side circuitry and secondary side circuitry while permitting signal transmission therebetween and also relates to integrated circuits employing the devices and, in more particular, to communication terminal apparatus including an analog front end (AFE) and/or a modulator/demodulator, called "modem."

Traditionally, individual or "discrete" electronics components such as transformers or photocouplers, also known as insulating couplers or isolators among those skilled in the art, are typically employed in cases where electrical insulation/isolation is to be established between a plurality of circuits while permitting signal transmission between them. For instance, in the field of communications technologies, higher dielectricity has been strictly required at boundaries between networks and terminals in order to provide enhanced protection for network facility with high publicities and also for terminal devices operatively associated therewith. To this end, isolators such as small-size communication-use transformers have been used. Alternatively in the fields of measurement technologies and medical industries, isolators have been used as means for providing electrical insulation and isolation between a signal detection unit and a signal processing unit, such as between a sensor module and its associative signal waveform processor circuitry, in a viewpoint of the safety for human bodies and measurement equipment with enhanced anti-noise performances.

In the case of using transformers to provide electrical insulation required, the quest for reduction in size and in weight is limited due to the presence of restrictions against materials and structures used, while accompanying a penalty as to unwanted cost/price increases. Isolators using a photocoupler with a combination of light-emitting element and photosensitive element for detection of light received are generally small in size and less in weight and also low in price. Unfortunately such photocoupler can readily vary in electrical characteristics thereof with a change in temperature or other parameters. Compensating for such characteristic deviation does require the use of a correction circuit, which in turn requires highly accurate control techniques. Another problem faced with the photocoupler-based isolators is that extra fabrication processes for manufacturing the light emitting and receiving elements should be required in addition to standard or ordinary fabrication processes in the manufacture of a semiconductor device.

Discrete components for constitution of insulation barriers include a ceramic capacitor for electric power supply or for serge protection. A signal transmission circuit using capacitors of this type is called the capacitive insulation amplifier or, alternatively, capacitive insulation coupler among those skilled in the art to which the invention pertains. Known methodology for signal transmission via such capacitive insulation barriers includes pulse width modulation (PWM) schemes. One typical signal transfer technique using three separate capacitive insulation barriers has been disclosed in Published Japanese Patent Application No. 7-307708 (corresponding to U.S. Pat. No. 5,654,984), along with a model application circuit using the barriers.

SUMMARY OF THE INVENTION

A primary object of the present invention is to realize and provide a semiconductor device of multi-chip configuration with more than one insulation barrier having high dielectricity being built in either a package or a module and also a small-size application circuit IC incorporating this device, which is less in parts-mount area.

Another object of this invention is to provide electronic apparatus employing one or more ICs of multi-chip configuration with these isolators built therein.

In near future, isolators will be required to further decrease in size and weight at low prices. In this point of view, these prior arts are encountered with disadvantages and problems which follow.

An insulation barrier having high withstanding or breakdown voltage performance and a signal modulation circuit unit operable to process an input signal to have a waveform suitable for transmission along with a signal demodulation circuit unit for returning its received transfer signal to an original signal are separate components respectively, and a plurality of components are mounted together in the same package to thereby constitute an isolator required. Accordingly, the requisite number of necessary components is increased while increasing the complexity in parts-mount/assembly process; furthermore, miniaturization or "downsizing" is also limited due to the fact that multiple parts are mounted together on a substrate.

In the case of prior art isolators using transformers or photocouplers or else, there are certain limits to downsizing and price reduction as required in the market, due to significance in number of parts or components during mounting and also complexity in structure of such components per se. Alternatively with isolators using capacitive insulation barriers, there is a limit to downsizing because of the fact that the capacitive barriers and transfer circuitry associated therewith are discrete components.

A semiconductor device of the present invention is such that external electrodes of high withstanding or withstand voltage capacitors being formed on or over a plurality of semiconductor chips are electrically connected together by wire bonding or printed circuit board lead wires or more than one lead frame. And, either a driver circuit for signal transmission or a receiver circuit for signal receipt which is formed on a semiconductor chip is electrically connected to a substrate-side electrode(s) of the aforesaid high withstand voltage capacitors. Whereby, capacitive insulation means is formed for permitting signal transmission between a primary side circuit and a secondary side circuit while at the same time providing electrical separation or isolation between the primary side circuit and the secondary side circuit. Said two semiconductor chips are received within either a single package or a single module.

With the semiconductor device of the instant invention, it is no longer required that said semiconductor chips be provided with any special insulation/isolation means including, but not limited to, trench isolation using a silicon on insulator (SOI) substrate and dielectric material isolation using a dielectric material isolation substrate or the like. Better results are obtainable by use of presently established standard PN junction isolation schemes for general use in low-voltage LSIs.

With a semiconductor device of the invention comprising an analog front end, its primary side circuit and secondary side circuits are an analog input/output side circuit and digital input/output side circuit respectively, wherein said capacitive insulation means is used to transmit a signal(s) between the analog input/output side circuit and the digital input/output side circuit while electrically insulating and isolating between the analog input/output side circuit and the digital input/output side circuit.

A modem device of the invention includes a semiconductor device having an analog front end, wherein such semiconductor device employs an analog front end-provided semiconductor device which is such that its primary side circuit and secondary side circuit are an analog input/output side circuit and a digital input/output side circuit respectively and that said capacitive insulation means is used to transmit a signal(s) between the analog input/output side circuit and the digital input/output side circuit while simultaneously letting the analog input/output side circuit and the digital input/output side circuit be insulated and isolated from each other.

With a semiconductor device of the invention comprising a transceiver for connection to communication lines or network links is such that its primary side circuit and secondary side circuit are a transceiver circuit and an application control circuit respectively, wherein said capacitive insulation means is used to transmit a signal or signals between the transceiver circuit and said application control circuit while insulating and isolating between the transceiver circuit and the application control circuit.

A communication terminal device of the invention is arranged to include a semiconductor device comprising a transceiver for connection to network links, wherein such semiconductor device specifically employs a transceiver-contained semiconductor device which is arranged so that its primary side circuit and secondary side circuit are a transceiver circuit and an application control circuit respectively and that said capacitive insulation means is used to transmit a signal(s) between the transceiver circuit and said application control circuit while simultaneously letting the transceiver circuit and the application control circuit be insulated and isolated from each other.

In accordance with the present invention, it is possible to realize a semiconductor device with reduced size and enhanced dielectricity. The use of an IC package or module of the multi-chip configuration including therein built-in isolator circuitry of the present invention and a plurality of circuit regions being electrically insulated and isolated from one another by such circuitry makes it possible to reduce resultant parts-mount areas while at the same time reducing or minimizing the requisite number of parts-mount/assembly process steps.

DESCRIPTION OF THE EMBODIMENTS

Several preferred embodiments of the present invention will now be set forth in detail with reference to the accompanying drawings below.

(Embodiment 1)

Figure 1:
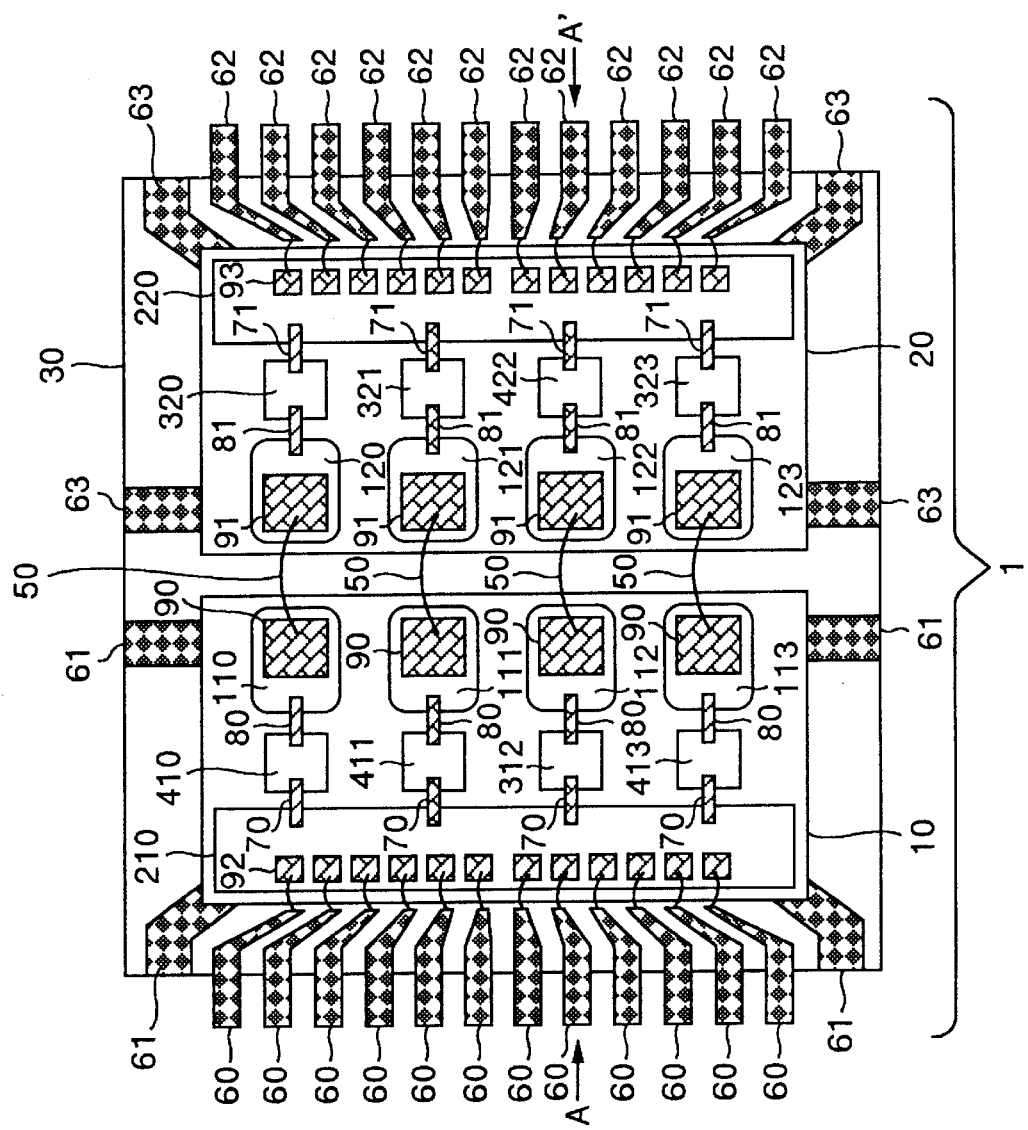
FIG. 1 is a diagram showing a plan view of a semiconductor device in accordance with an embodiment 1 of the present invention.
Figure 2:
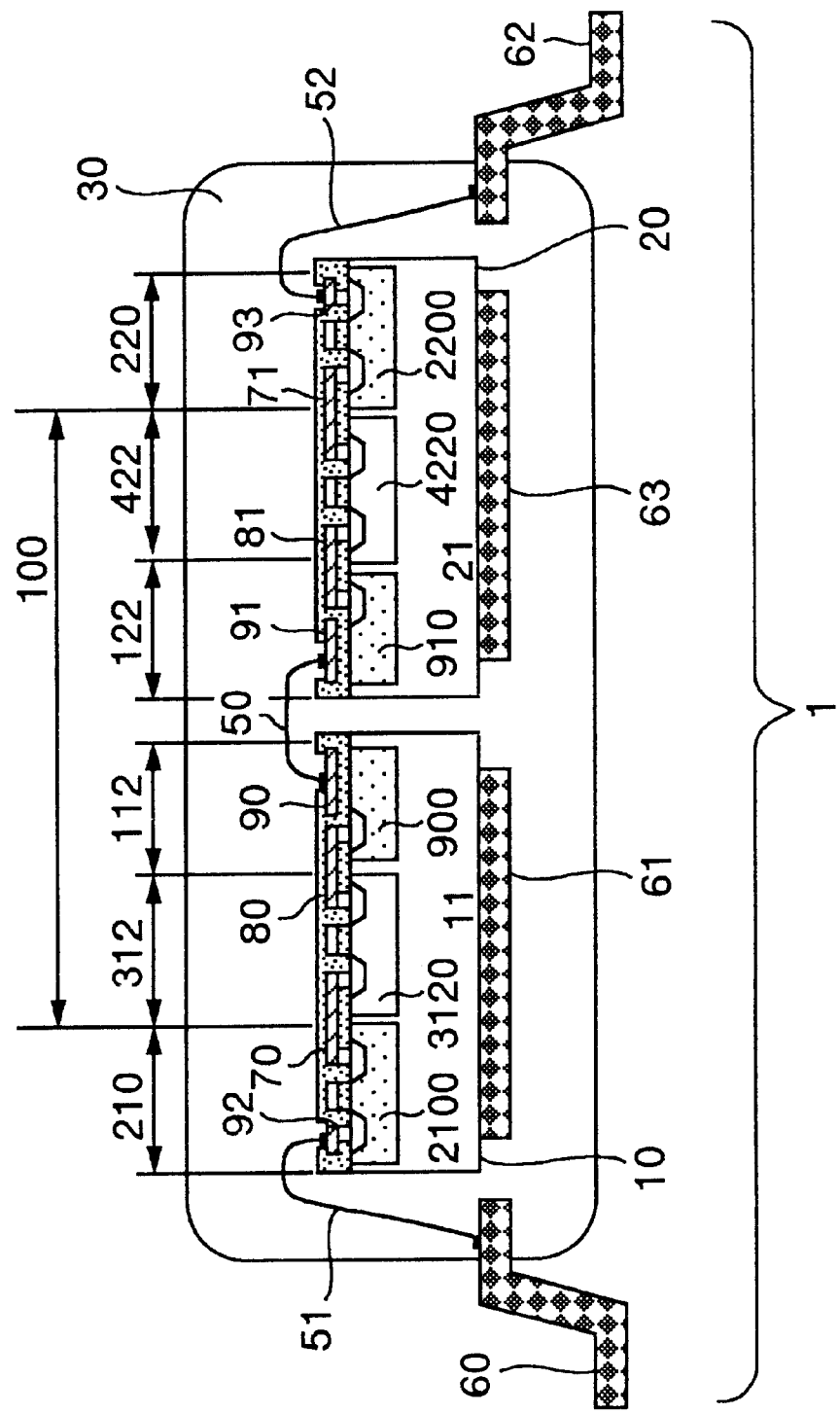
FIG. 2 is a diagram schematically showing a cross-sectional view of the embodiment 1.

A planar configuration of a semiconductor device in accordance with one embodiment is schematically shown in FIG. 1. A cross-sectional structure thereof as taken along arrows A, A' of FIG. 1 is shown in FIG. 2. In FIGS. 1 and 2, the semiconductor device of the illustrative embodiment is indicated as a multiple-chip integrated circuit (IC) 1. The multi-chip IC 1 includes a first chip 10, a second chip 20, lead frames 60, 62 for use as terminals which input and output signals to and from the chips associated therewith, lead frames 61, 63 serving as support bodies upon mounting of said two chips, and a package 30 for mounting these components therein.

The first chip 10 is generally constituted from a primary side circuit 210, receiver circuits 410, 411, 413, a driver circuit 312, high withstand/breakdown voltage capacitive elements 110, 111, 112, 113, wherein electrical connection pads 92 are provided for use as electrodes for electrically connecting certain signals being input and output to and from the lead frame 60 to the primary side circuit 210 through bonding wires whereas pads 90 are provided as external side electrodes of the high withstand voltage capacitors 110 to 113, wherein the pads are connected via bonding wires 50 to pads 91 for use as external electrodes of high withstand voltage capacitors 120, 121, 122, 123 as formed on the second chip 20. Electrical wiring leads 70 are signal transmission lines which electrically tie the primary side circuit 210 to either the receiver circuits 410–411 and 413 or the driver circuit 312 whereas leads 80 are signal transfer lines for electrically tying substrate side electrodes 900 (see FIG. 2) of the high withstand voltage capacitors 110–113 to either the receiver circuits 410–411, 413 or the driver circuit 312.

Similarly the second chip 20 is generally made up of a secondary side circuit 220, a receiver circuit 422, driver circuits 320, 321, 323, high withstand voltage capacitors 120, 121, 122, 123, wherein pads 93 are provided for use as electrodes which electrically connect those signals being input and output to and from the lead frame 62 to the secondary side circuit 220 via bonding wires whereas pads 91 are provided as external side electrodes of the high withstand voltage capacitors 120 to 123, the pads being connected by bonding wires 50 to the pads 90 for use as external electrodes of high withstand voltage capacitors 110–113 as formed on the first chip 10. Electrical wiring leads 71 are signal transmission lines that electrically tie the secondary side circuit 220 to either the receiver circuit 422 or the driver circuits 320–321, 323 whereas leads 81 are signal transfer lines for electrically tying substrate side electrodes 910 (see FIG. 2) of the high withstand voltage capacitors 120–123 to either the receiver circuit 422 or the driver circuits 320–321, 323.

As shown in FIG. 2, the first chip 10 and second chip 20 are received within the package 30 having dielectricity so that the substrate 11 of first chip 10 and the substrate 21 of second chip 20 are electrically insulated and isolated from each other by package material. Additionally the first and second chips are packaged in such a manner that these are appropriately spaced apart from each other by a specified distance permitting acquisition of a desired withstanding or breakdown voltage level. Accordingly, with the first and second chips, it will no longer be required to provide any special insulation/isolation means such as trench isolation using silicon-on-insulator (SOI) substrates and/or dielectric material isolation using dielectric material isolation substrates, and any satisfiable results may be obtained by use of currently available PN junction isolation techniques as generally employed in low-voltage LSIs.

An isolator circuit 100 (see FIG. 2) is provided essentially with the first chip 10's driver circuit 312, high withstand voltage capacitor 112, bonding wires 50, 51, 52 second chip 20's high withstand voltage capacitor 112, and receiver circuit 422 within a package 30. In FIG. 1 four separate isolator circuits are provided. And the primary side circuit 210 and secondary side circuit 220 which are connected to the isolator circuitry 100 are electrically insulated via primary side high withstand voltage capacitors 110–113 and secondary side high withstand voltage capacitors 120–123. In brief, even when an abnormally high potential voltage of 1,500 volts (V) at commercially available standard frequencies is applied between the lead frames 60 and 62, most part of such voltage will be applied to the high withstand voltage capacitors 110–113 and 120–123. One example is that in case the primary side high withstand voltage capacitors 110–113 and secondary side high withstand voltage capacitors 120–123 are the same in capacitance value, the applied voltage will be substantially equally shared or "allotted" by the primary side high withstand voltage capacitor unit and the secondary side high withstand voltage capacitor unit— approximately 750V for each. Due to this, any abnormal voltage will hardly be applied to the primary side and secondary side circuits, receivers, and driver circuits, thus enabling these circuits to be formed of low-voltage electronic circuit elements with ratings of 3.3 V or less.

Figure 3A:
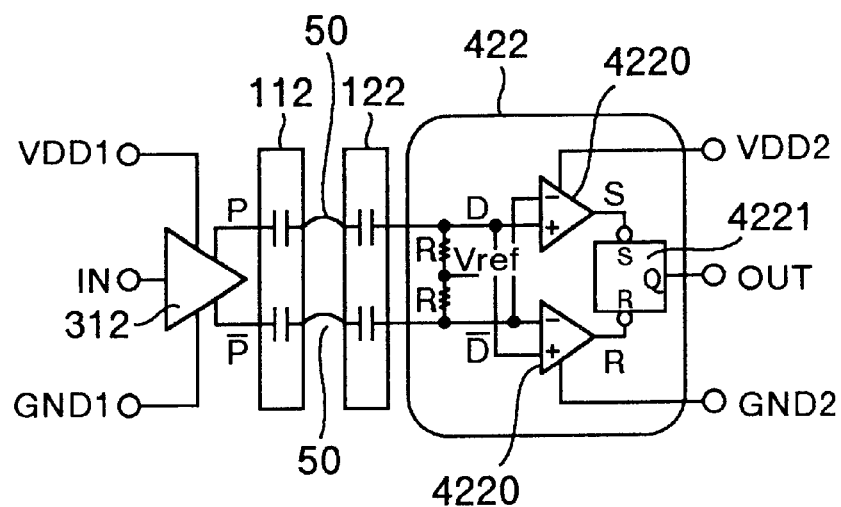
FIG. 3A illustrates in block form a configuration of an isolator circuit unit of the semiconductor device of the embodiment 1.
Figure 3B:
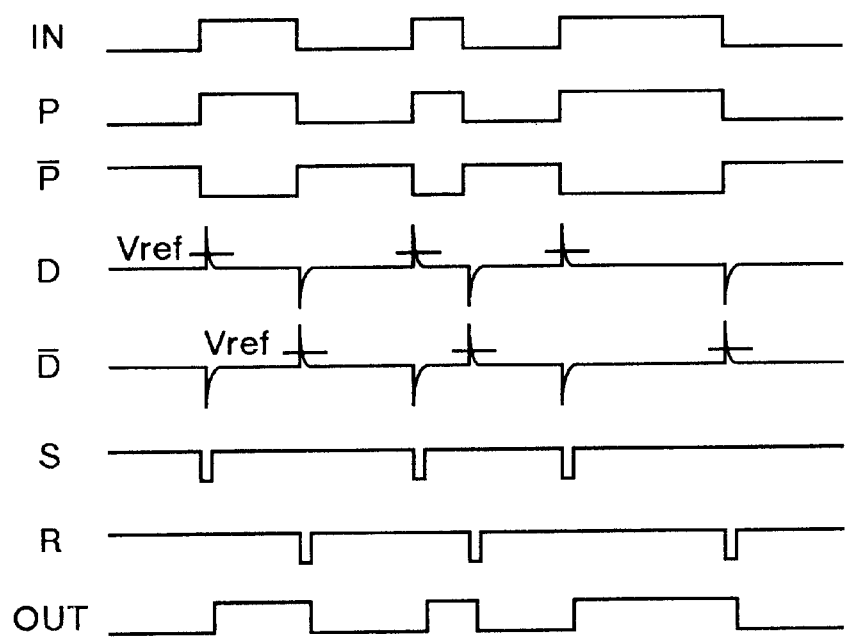
FIG. 3B depicts some major signal waveforms during operation of the isolator circuit unit of the semiconductor device of the embodiment 1.

An explanation will next be given of an operation of the isolator circuitry with reference to FIGS. 3A and 3B below. FIG. 3A illustrates in schematic block form the configuration of an isolator circuit; FIG. 3B depicts waveforms of some major signals during operation thereof. The driver circuit 312 may be a differential amplifier circuit which is responsive to receipt of an input pulse signal IN for generating and issuing complementary pulse signals P and /P, where "/P" stands for "P(Bar)," i.e. an inverted version of pulse signal P). A respective one of blocks 112, 122 shown herein is formed of a pair of high withstand voltage capacitors operable to transfer by capacitive coupling the complementary pulse signals P, /P toward the receiver circuit 422 (in FIGS. 1–2, each is represented by a single output and single capacitance without using differential outputs for purposes of brevity in illustration only). A resistor R within the receiver circuit 422 is a differential resistor used in combination with the high withstand voltage capacitors 112, 122 to convert the complementary pulse signals P, /P being transferred due the capacitive coupling into differential signals D, /D (where "/D" refers to an inverted signal of signal D). A transition detection circuit 4220 is provided for detecting from the differential signals D, /D the transition timing of input pulse signal IN; a pulse reproduction or "retrieve" circuit 4221 is for reproducing an original pulse signal(s) from resultant transition detection signals S, R as detected by the transition detector circuit 4220.

The pulse signal IN to be sent from the primary side circuit 210 to the secondary side circuit 220 is used for generation of the pulse signals P, /P by the driver circuit 312 formed of differential amplifier circuitry to thereby drive the primary side (corresponding to part 900 in FIG. 2) of the high withstand voltage capacitor 112. Owing to the high withstand voltage capacitors 112, 122 and differential resistor R, differential signals D, /D are output at the secondary side (corresponding to 81 of FIG. 2) of the high withstand voltage capacitor 122. Obtained by the transition detector circuit 4220 from these differential signals D, /D are transition detection signals S, R relating to transition timings of the input pulse signal IN. The transition detection signals S, R are used by pulse reproduction circuit 4221 to reproduce more than one pulse to thereby output a reproduction or "playback" pulse signal OUT, which is then input to the secondary side circuit 220. In accordance with the semiconductor device embodying the invention, it is possible to transfer only signal components to the output side while at the same time realizing higher dielectric characteristics between the input and the output.

The semiconductor device of the present invention is manufacturable by standard or "ordinary" manufacturing technologies excluding any special semiconductor fabrication processes and LSI assembly processes. In addition, simultaneous mounting and packaging of two separate chips each containing one or more high withstand voltage capacitors enables resultant parts-mount areas to decrease when compared to the prior art while reducing the requisite number of mount/assembly process steps.

It should be noted here that although in the embodiment discussed above one specific case is indicated where both the first chip 10 and the second chip 20 have high withstand voltage capacitors, these capacitors may be formed only at either one of them in a way conformity with dielectric withstanding voltage levels required. In addition, although in this embodiment the substrate-side electrodes of high withstand voltage capacitors 110, 120 are designed as diffusion layers 900, 910 as formed within the first and second chips 10, 20, these are replaceable by metals or polycrystalline silicon (poly-silicon) wiring layers when the need arises. Additionally more than two semiconductor chips may be mounted in a package.

(Embodiment 2)

Figure 4:
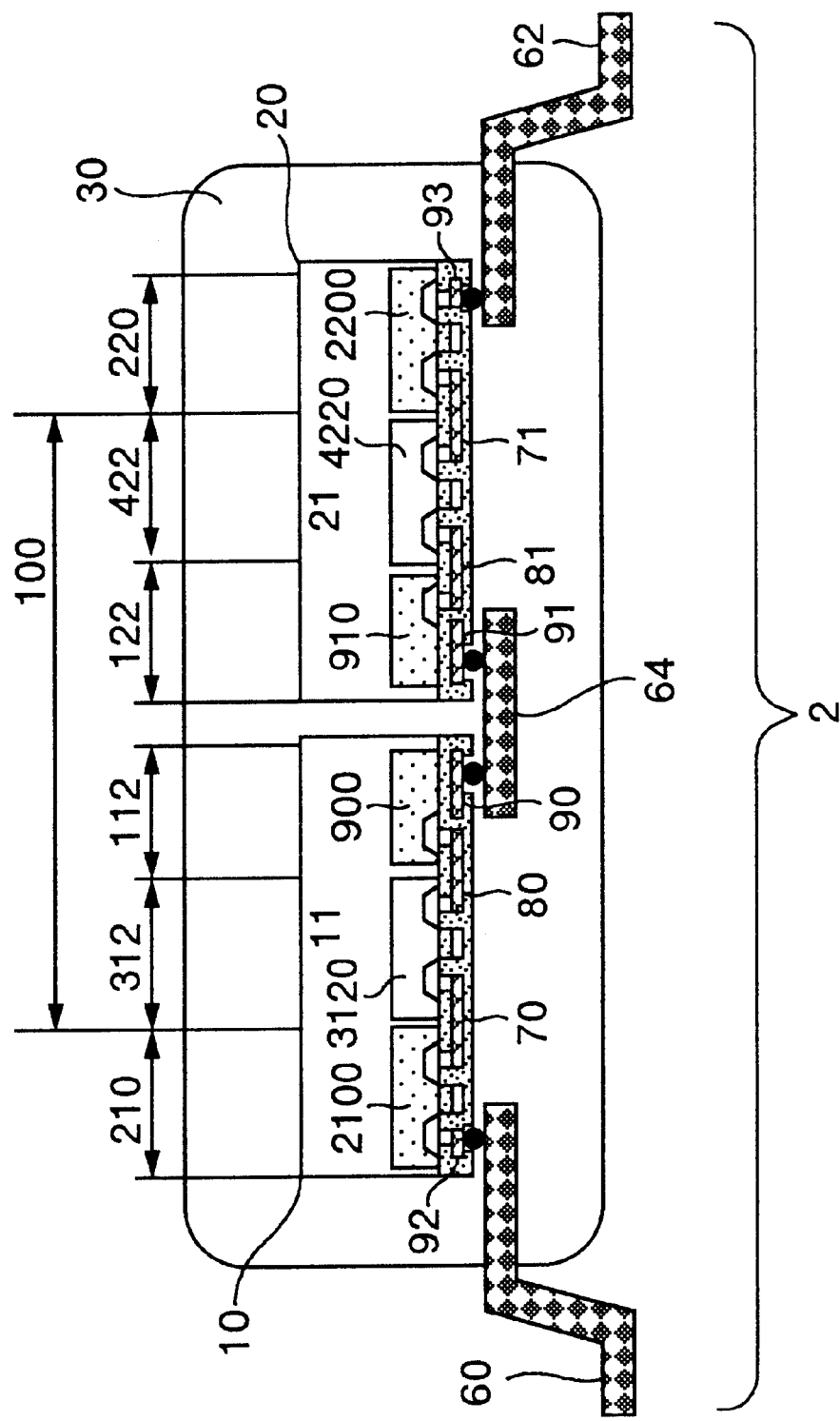
FIG. 4 is a diagram showing a schematical sectional view of a semiconductor device in accordance with an embodiment 2 of this invention.

See FIG. 4, which depicts in schematic cross-section the structure of a semiconductor device in accordance with a second embodiment of the invention. This embodiment relates to multi-chips IC 2. This embodiment is different from the above-stated embodiment 1 in that the element formation regions of the first chip 10 and second chip 20 are laid out downwardly in FIG. 4 with the bonding wires for connection between the high withstand voltage capacitor 112's external side electrodes 90 and the high withstand voltage capacitor 122's external side electrodes 91 being replaced with a combination of solder balls as provided on surfaces of the external electrodes 90, 91 and a lead frame 64, and in that connection between the primary side circuit 210's electrodes 92 and the lead frame 60 and also connection between the secondary side circuit 220's electrodes 93 and a lead frame 62 are done by solder balls being provided on the surfaces of external side electrodes 92, 93 in place of the bonding wires 51, 52 stated supra. Numerals 900, 910, 2100 and 2200 denote diffusion layers. Numerals 70, 71, 80, 81 denote metallic wirings.

As in the embodiment 1, the embodiment of FIG. 4 is also capable of transferring signal components to the output side while simultaneously realizing higher dielectric characteristics between the input and output.

(Embodiment 3)

Figure 5:
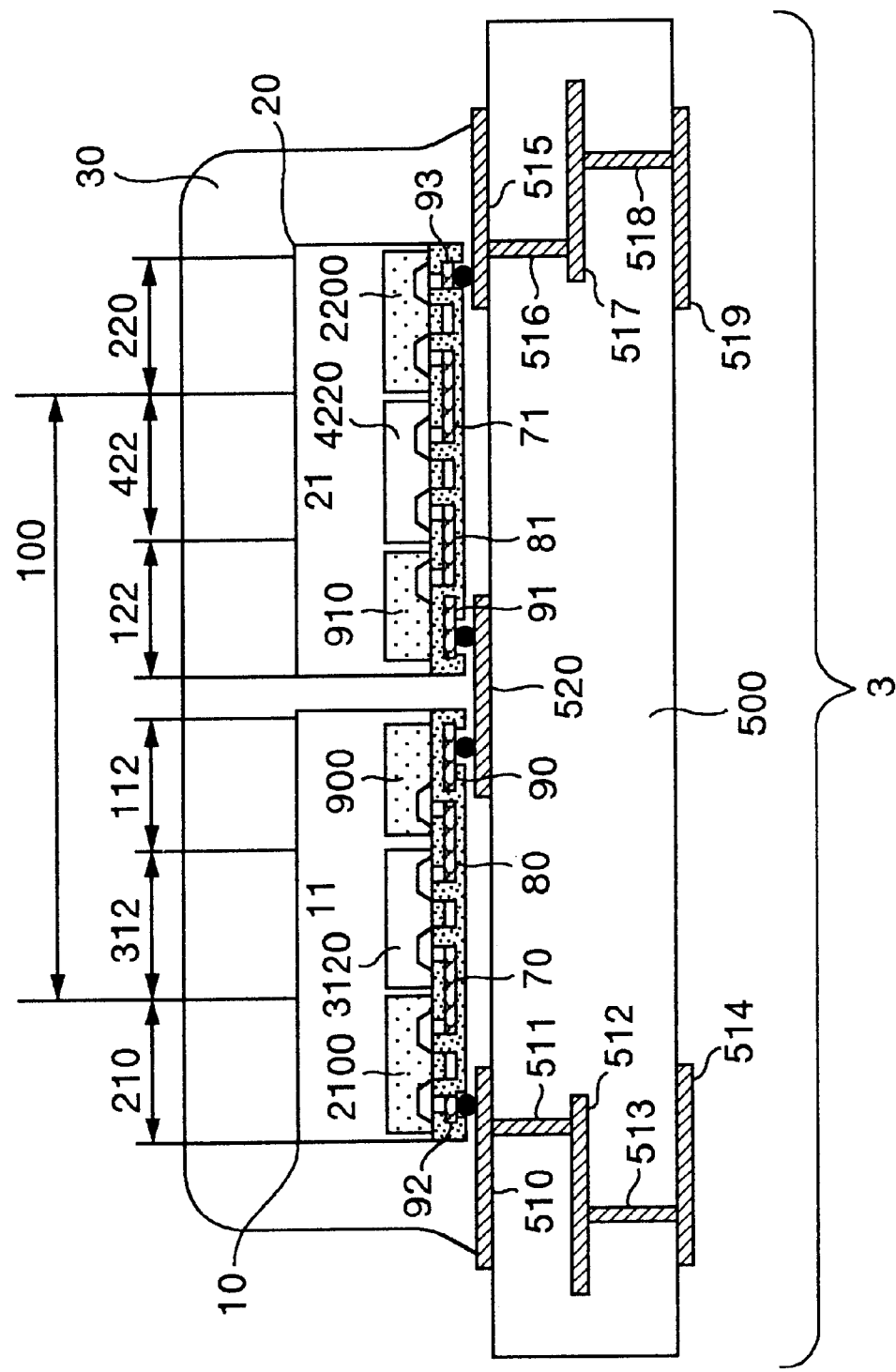
FIG. 5 shows a schematic sectional view of a semiconductor device in accordance with an embodiment 3 of the invention.

FIG. 5 shows schematically a cross-sectional structure of a semiconductor device in accordance with a third embodiment of the invention. This embodiment relates to a multi-top module 3. This embodiment is the one that employs wiring leads 510, 515, 520 on respective printed circuit boards as a substitute for the lead frames 60, 62, 64 of the second embodiment 2 discussed above. Wiring lead 510 is connected via a solder ball to the electrode 92 of the primary side circuit 210 whereas lead 515 is connected by a solder ball to the electrode 92 of secondary side circuit 220. Additionally the lead 520 is for connection between the external side electrode 90 of high withstand voltage capacitor 112 and the external side electrode 91 of high withstand voltage capacitor 122. A numeral 500 denotes a print board.

With this embodiment shown herein, a bare chip or chips is/are provided on or over a printed circuit board so that the first and second chips are sealed by dielectric resin 40 rather than by the package. As in the embodiment 1, the embodiment 3 is also capable of transferring signal components to the output side while at the same time realizing enhanced dielectric characteristics between the input and output.

(Embodiment 4)

Figure 6:
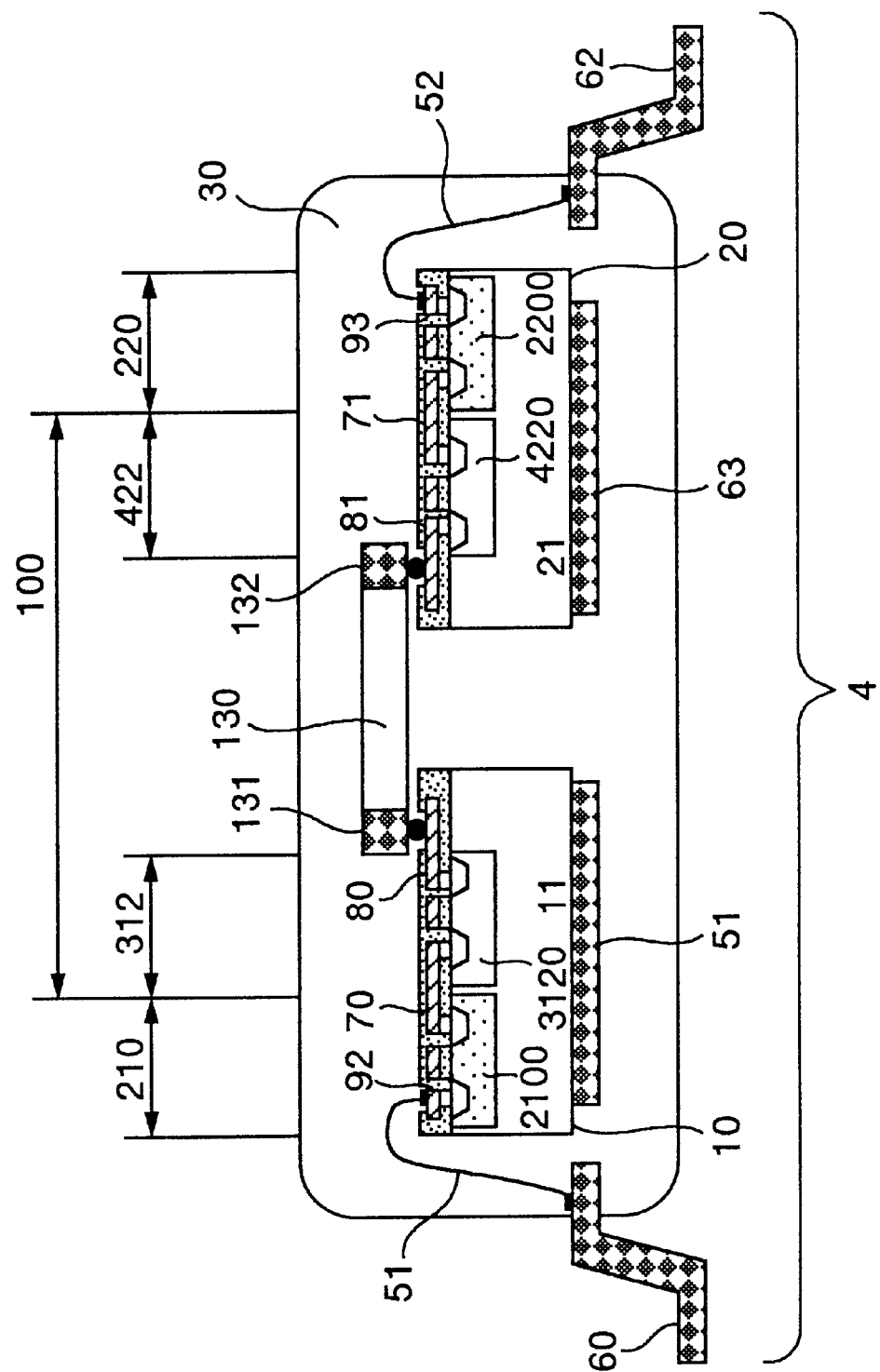
FIG. 6 is a schematic sectional view of a semiconductor device in accordance with an embodiment 4.

FIG. 6 shows a sectional structure of a semiconductor device in accordance with a fourth embodiment of the invention. This embodiment relates to a multi-chip IC 4. This embodiment shown herein is different from the embodiment 1 in that no high withstand voltage capacitors are provided on both the first chip 10 and the second chip 20 and, instead, electrodes 131 and 132 of a high withstand/breakdown voltage capacitance chip 130 are connected to output side wiring leads 80 of driver circuit 312 being provided on the first chip and input side leads 81 of receiver circuit 422 as provided on the second chip, respectively. Note here that the high withstand voltage capacitor chip 130 is either a high withstand voltage multilayer ceramic capacitor or a ceramic capacitor, by way of example.

In the case of this embodiment also, even when an abnormally high potential voltage of 1,500 V at commercially available standard frequencies is applied between the lead frames 60 and 62, most part of such voltage will be applied to the high withstand voltage capacitor 130. Consequently as in the embodiment 1, the embodiment 3 is also capable of transferring signal components to the output side while simultaneously realizing higher dielectric characteristics between the input and output.

The semiconductor device of this invention is manufacturable by ordinary manufacturing techniques excluding any special semiconductor fabrication processes and LSI assembly processes. In addition, simultaneous mounting into a single package the high withstand voltage capacitor chip 130 and two separate semiconductor chips enables the resulting parts-mount/assembly area to decrease when compared to the prior art while reducing the requisite number of assembly process steps.

(Embodiment 5)

Figure 7:
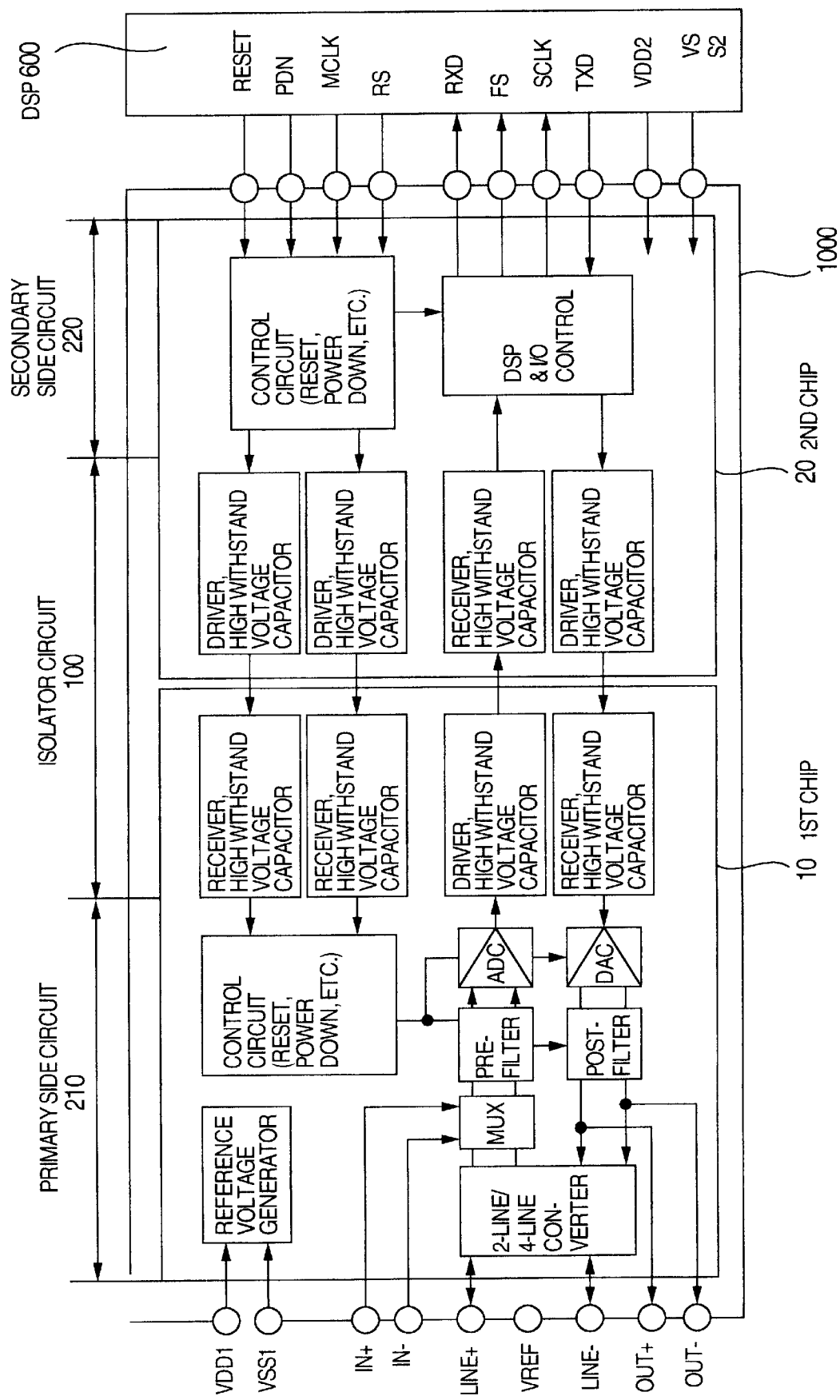
FIG. 7 is a block circuit diagram of an analog front end (AFE) for use with communication circuitry in accordance with an embodiment 5.

This embodiment is such that the semiconductor device of from the embodiment 1 to embodiment 4 is applied to an analog front end (AFE). A circuit configuration of this embodiment is shown in FIG. 7 in block form. In FIG. 7, reference numeral 1000 designates the semiconductor device of from the embodiment 1 to embodiment 4.

The first chip 10's primary side circuit 210 is mainly formed of a two-line/four-line conversion circuit, multiplexer (MUX), analog-to-digital converter (ADC) circuit, digital-analog converter (DAC) circuit, pre-filter, post-filter, control circuit for performing reset and power-down operations, and reference voltage generation circuit. The reference voltage generator circuit is operable to generate a reference voltage Vref to be supplied to analog circuitry operatively associated therewith.

The secondary side circuit 220 of second chip 20 consists essentially of a control circuit operable to perform digital signal processing, input/output control, reset and power-down operations. Here, its digital signal processing and input/output control circuit section is typically made up from a DA conversion input buffer, AD conversion output buffer, built-in or "internal" digital signal processor (DSP), DSP input/output transfer controller, received signal/data buffer and transmit data buffer, although not specifically depicted herein.

An explanation will now be given of an operation of the internal circuitry of the semiconductor device 1000. The 2-line/4-line converter circuit is the circuitry that performs changeover or switching of 2-line circuit lines being connected to LINE+, LINE– to a 4-line circuit within the semiconductor device 1000 in a way conformity with occurrence of signal transmit and receive events in cases where the semiconductor device 1000 is for use in modulator/demodulator or "modem" devices, which circuit functions as a line impedance matching and input/output amplifier.

In the signal receipt system, one or more analog input signals are input and output via the 2-line/4-line converter circuit or, alternatively, input from IN+, IN– terminals, wherein this changeover is done by the multiplexer MUX. The analog input signals are such that signals of unnecessary frequency bands are deleted therefrom by the prefilter (e.g. second-order low-pass filter with its cutoff frequency of 48 KHz) prior to execution of AD conversion. And a second-order $\Delta\Sigma$ modulator ADC operable at 2 Msps is used to output a 2-bit digital signal once at a time whenever a time of 0.5 $\mu$s is elapsed, which is then processed to decrease in pulse number or "thinned out" into 32 Ksps at a decimeter of the next stage (not shown); thereafter, 16-bit/w data is subject to serial conversion to 2 Msps prior to entering the isolator circuit. The data passed through such isolator circuit will then be input to the digital signal processing and input/output control circuit. Here, flat characteristic correction and/or low-pass filter processing at 4 KHz or less is performed causing it to be transferred toward an external DSP 600 as 16-bit/w data per 8 Ksps (i.e. input to RXD terminal).

Next, in the signal transmit system, data being output from a TDX terminal of the external DSP 600 will then be subject to similar processing to that executed in the signal receipt event at the digital signal processing and input/output control circuit. 16-bit/w data is serial-converted into 2 Msps before entering the isolator circuit and, after having passed through the isolator circuit 100, enters an interpolation filter (not shown). The resultant data that has been interpolation-processed and thus becomes 6-bit/w data is then converted by a $\Delta\Sigma$ modulator DAC into a corresponding analog signal. After having removed at the postfilter certain turnaround or "folded" components presently residing through the interpolation processing or the like, the signal is output via the 2-line/4-line converter circuit onto 2-line circuit lines being connected to LINE+, LINE–.

It must be noted that the operation timing of internal circuitry of the semiconductor device 1000 is determined with certain clocks being each used as the reference therefor, which clocks include a clock of 2 MHz (MCLK) as given by the external DSP 600 and a clock as converted therefrom at a phase-locked loop (PLL) present within the control circuit of the secondary side circuit 220 to have a frequency of 16 MHz which is eight times greater than that of the former. These reference clock signals are also sent to the control circuit of the primary side circuit 210 via the isolator circuit 100, based on which signals a variety of timing control operations are being performed.

(Embodiment 6)

Figure 8:
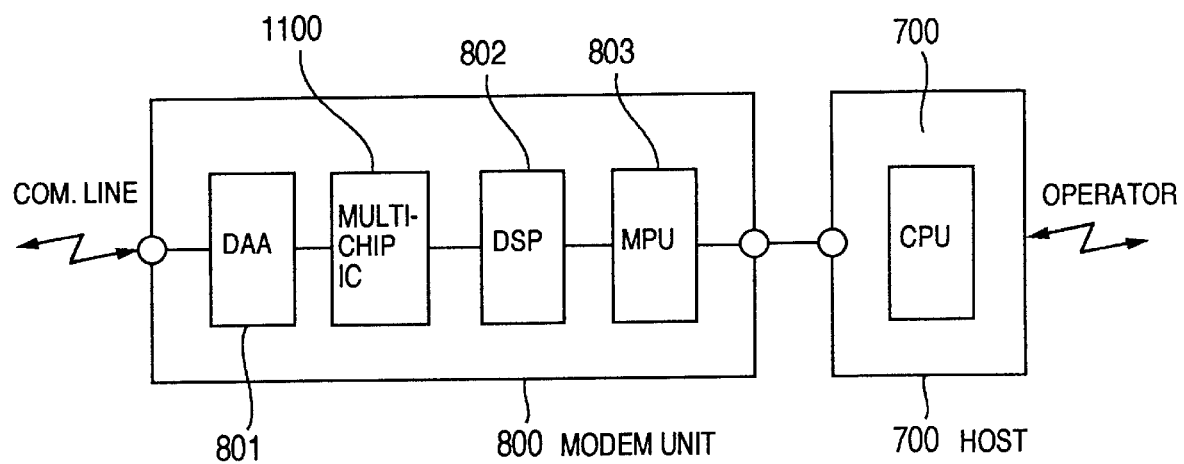
FIG. 8 is a diagram showing circuit configurations of a modem and a host section of an embodiment 6.

This embodiment is a communications system employing in combination a host 700 and a modem unit 800 using an analog front end (AFE) LSI 1100 using the semiconductor device of from the embodiment 1 to embodiment 4. FIG. 8 is a diagram showing a configuration of the embodiment. Reference numeral 1100 designates the AFELSI including, in a similar way to that shown in FIG. 7, an isolator circuit, ADC, DAC, filters, DSP, control circuit and others. Numeral 801 denotes a direct access arrangement (DAA) unit, which is formed of more than one protective element, connection switch, DC open/close circuit, DC open/close circuit switch, call-up signal detector circuit and others. Numeral 802 indicates a modulation/demodulation means such as for example a DSP; 803 is a transfer control circuit consisting essentially of a multi-processor unit (MPU), memory, software programs and others. 700 is an application control means such as a special-purpose or "dedicated" DSP or a host CPU as built in personal computers (PCs), workstations (WSs), personal digital assistants (PDAs) or else—here, called the "host." With this embodiment, using the AFELSI 110 makes it possible to delete any extra insulation transformers inherently high in price and large in mount areas as have been traditionally employed within DAAs, thus enabling achievement of size reduction or "downsizing" of the communications system concerned.

(Embodiment 7)

Figure 9:
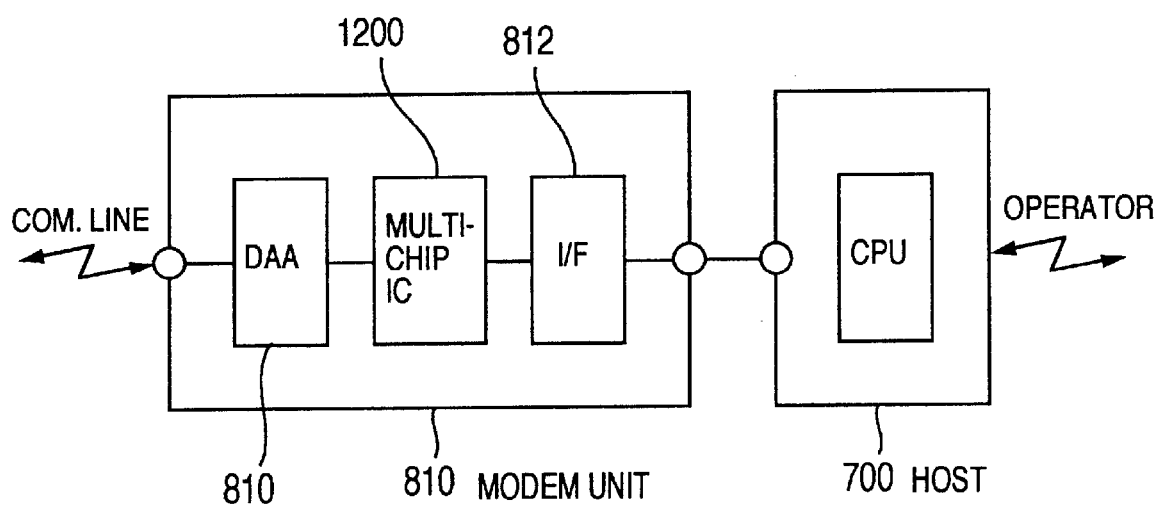
FIG. 9 depicts circuit configurations of a modem and host section of an embodiment 7.

This embodiment is a soft modem system which employs an AFE-LSI 1200 using the semiconductor device of from the embodiment 1 to embodiment 4 stated previously. FIG. 9 is a diagram showing a configuration of this embodiment. Numeral 1200 denotes the AFELSI that includes, in a similar way to that shown in FIG. 7, an isolator circuit, ADC, DAC, filters, DSP, control circuit and the like. 812 indicates an interface means for connection between a host 710 for use as application control means and the AFELSI 1200 with built-in modulation/demodulation means, also including a buffer memory with its storage capacity of about 0.5 megabytes (MB) and other control logic circuits. Note here that the interface (I/F) means 812 may alternatively be built in the AFELSI 1200. Numeral 810 denotes a modem unit.

The illustrative soft modem system also embodying the invention is such that all the modulation/demodulation means and transfer control means are processed at a time by the CPU of the host 710 thereby deleting the DSP 802 for use as the modulation/demodulation means and also the MPU 803 being the transfer control means, which in turn makes it possible to significantly reduce the size of the modem device.

(Embodiment 8)

Figure 10:
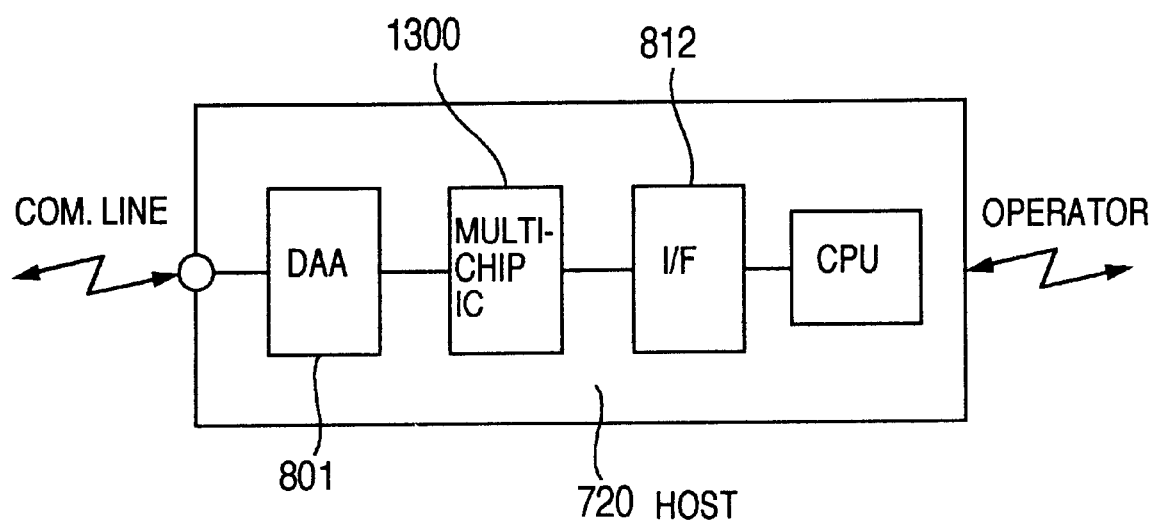
FIG. 10 shows circuit configurations of a modem and host unit of an embodiment 8.

This embodiment is a soft modem system which employs an AFELSI 1300 using the semiconductor device of from the embodiment 1 to embodiment 4. FIG. 10 is a diagram showing a configuration of this embodiment. Numeral 1300 designates the AFELSI including, in a similar way to that shown in FIG. 7, an isolator circuit, ADC, DAC, filters, DSP, control circuit and the like. With this embodiment, all the constituent parts or components of the soft modem using the AFELSI 1300 are accommodated and integrated together within a host 720 for use as the application control means.

(Embodiment 9)

Figure 11:
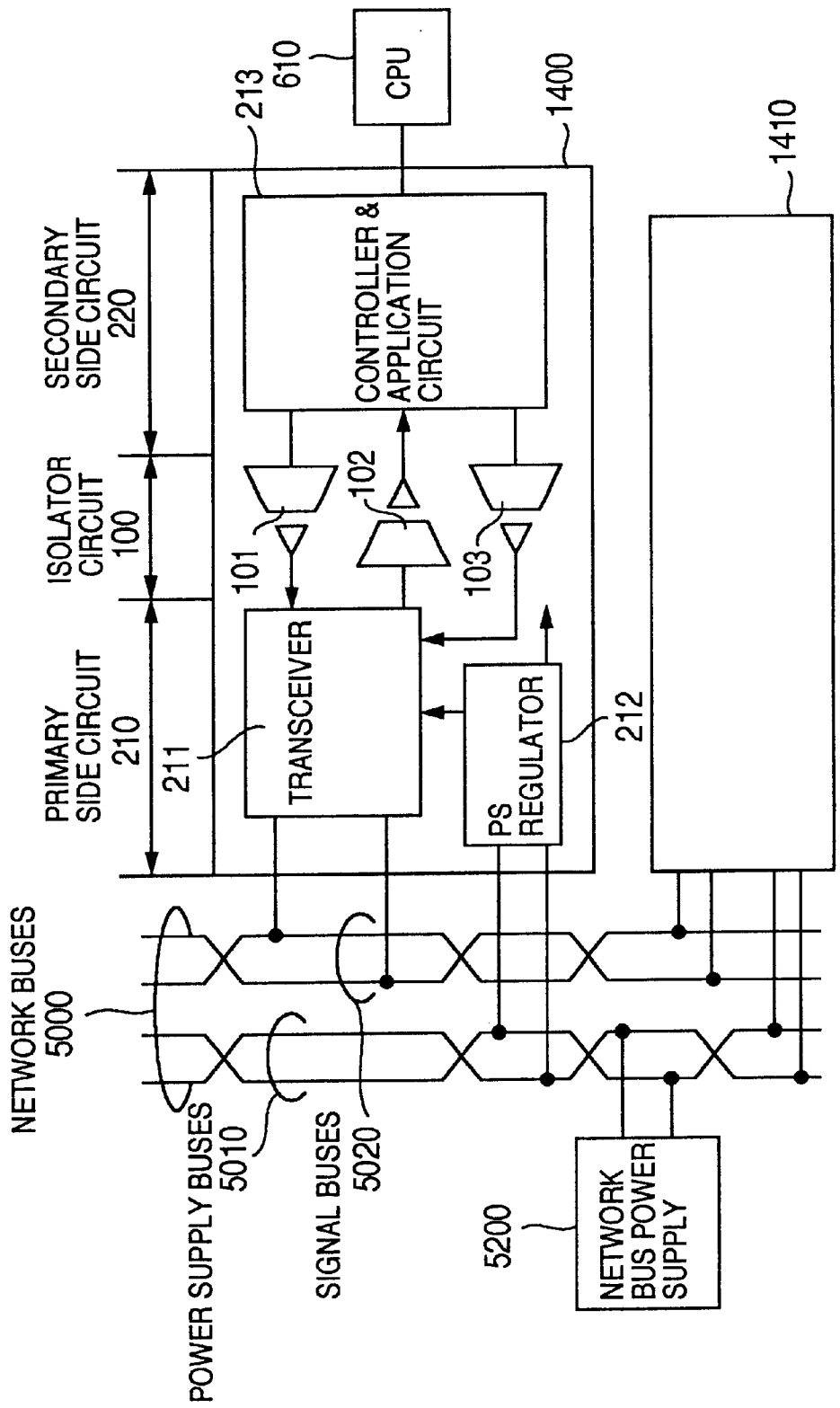
FIG. 11 is a circuit block diagram of an embodiment 9.

This embodiment is a network system which employs transceiver LSIs 1400, 1410 using the semiconductor devices of from the embodiment 1 to embodiment 4. FIG. 11 is a diagram showing a configuration of this embodiment. In FIG. 11, numeral 213 designates a controller & application circuit; 101–103 denote isolator circuits; 211 is a transceiver; 212, power supply regulator. These components make up the transceiver LSI 1400. 1411 is the other transceiver LSI. The transceiver LSIs 1400, 1410 are each parallel-connected to associative network buses 5000. The network buses 5000 include power supply buses 5010 and signal transmission buses 5020 plus control signal buses (not shown), with the power supply buses 5010 being connected to a network bus power supply unit 5200. The transceiver LSIs 1400, 1410 each include its internal controller & application circuit 213, which is electrically insulated and isolated by the isolator circuits 101–103 from the transceiver 211 and power supply regulator 212. The transceiver 211 receives electric power as supplied from the power supply buses 5010 via power supply regulator 212. A received signal or signals from the signal buses 5020 will be transferred to a CPU 610 through the transceiver 211, isolator circuit 102, and controller & application circuit 213 in this order of sequence. Alternatively a transmit signal(s) from CPU 610 is/are sent to signal buses 5020 via the controller/application circuit 213, isolator circuit 101 and transceiver 211 in this order.

In the event that communications are established between the transceiver LSI 1400 and the remaining transceiver LSI 1410, the transceiver of one transceiver LSI to be activated for start-up is driven to go off its standby state while monitoring a received signal(s) R on the signal buses 5020 for acknowledgment of vacancy or "non-busy" of such signal buses 5020 to thereby permit over-the-air transmission of a transmit signal T aimed at the other transceiver LSI. The other transceiver LSI operates to release the transceiver's standby state from time to time while monitoring the state of a received signal(s) R and/or control signal buses (not shown) and, upon ascertainment or verification of the receipt of a signal aimed at itself, sequentially receive such signal(s).

With regard to the present invention, what is disclosed herein is as follows.

(1) A semiconductor device comprising a first semiconductor substrate, a second semiconductor substrate, a primary side circuit being provided on said first semiconductor substrate, a secondary side circuit as provided on said second semiconductor substrate, first capacitive insulation means provided on said first semiconductor substrate for electrically insulating and isolating between said primary side circuit and said secondary side circuit while permitting signal transmission between said primary side circuit and said secondary side circuit, second capacitive insulation means provided on said second semiconductor substrate for electrically isolating between said primary side circuit and said secondary side circuit while permitting signal transmission therebetween, a first lead frame for input and output of a signal to and from each of said primary side circuit and said secondary side circuit, a second lead frame for signal input and output to and from each of the primary and secondary side circuits, a third lead frame supporting thereover said first semiconductor substrate, and a fourth lead frame supporting said second semiconductor substrate, wherein an external electrode of said first capacitive insulation means and an external electrode of said second capacitive insulation means are connected together by a bonding wire while letting said first semiconductor substrate and said second semiconductor substrate plus the first to fourth lead frames be sealed by a dielectric resin.

(2) A semiconductor device comprising a first semiconductor substrate, a second semiconductor substrate, a primary side circuit being provided on said first semiconductor substrate, a secondary side circuit as provided on said second semiconductor substrate, first capacitive insulation means provided on said first semiconductor substrate for electrically insulating and isolating between said primary side circuit and said secondary side circuit while permitting signal transmission between said primary side circuit and said secondary side circuit, second capacitive insulation means provided on said second semiconductor substrate for electrically isolating between said primary side circuit and said secondary side circuit while permitting signal transmission therebetween, a first lead frame for input and output of a signal to and from each of said primary side circuit and said secondary side circuit, and a second lead frame for signal input and output to and from each of the primary and secondary side circuits, wherein an external electrode of said first capacitive insulation means and an external electrode of said second capacitive insulation means are connected together by said fifth lead frame via a conductive adhesive body including more than one solder ball while letting said first semiconductor substrate, said second semiconductor substrate, said first lead frame, second lead frame and fifth lead frame be sealed by a dielectric resin.

(3) A semiconductor device comprising a first semiconductor substrate, a second semiconductor substrate, a primary side circuit being provided on said first semiconductor substrate, a secondary side circuit as provided on said second semiconductor substrate, first capacitive insulation means provided on said first semiconductor substrate for electrically insulating and isolating between said primary side circuit and said secondary side circuit while permitting signal transmission between said primary side circuit and said secondary side circuit, second capacitive insulation means provided on said second semiconductor substrate for electrically isolating between said primary side circuit and said secondary side circuit while permitting signal transmission therebetween, first and second printed wiring board leads for input and output of a signal to and from said primary side circuit and said secondary side circuit, and a printed wiring board supporting thereover said first semiconductor substrate and second semiconductor substrate, wherein external electrodes of said first capacitive insulation means and said second capacitive insulation means are connected via a conductive adhesive body to a third printed wiring board lead as railed on said printed wiring board while letting said first semiconductor substrate, second semiconductor substrate, printed wiring board leads of said third printed wiring board leads and part of the first and second printed wiring board leads be sealed together by a dielectric resin on or over said printed wiring board.

(4) The semiconductor device as recited in any one of the preceding paragraphs (1) to (3), wherein said first capacitive insulation means is a capacitor comprising a dielectric layer disposed over said first semiconductor substrate and a plurality of electrodes whereas said second capacitive insulation means is a capacitor comprising a dielectric layer disposed over said second semiconductor substrate and a plurality of electrodes.

(5) The semiconductor device as recited in the preceding paragraphs (4), wherein said dielectric layer is an interlayer dielectric film.

(6) The semiconductor device as recited the paragraph (5), wherein at least one of said plurality of electrodes is any one of a metal layer and a polycrystalline silicon layer.

(7) The semiconductor device as recited in the paragraph (4), wherein one of said plurality of electrodes is a diffusion layer as formed at said first and second semiconductor substrates.

(8) The semiconductor device as recited in the paragraph (7), wherein said dielectric layer is an interlayer dielectric film.

(9) The semiconductor device as recited in the paragraphs (8), wherein at least one of said plurality of electrodes is any one of a metal layer and a poly-silicon layer.

(10) The semiconductor device as recited in any one of the preceding paragraphs (1) to (3), wherein element isolation of either one of said first semiconductor substrate and said second semiconductor substrate is PN junction isolation.

(11) A semiconductor device comprising a first semiconductor substrate, a second semiconductor substrate, a primary side circuit as formed on said first semiconductor substrate, a secondary side circuit formed on said second semiconductor substrate, a first lead frame for input and output of a signal to and from said primary side circuit, a second lead frame for input and output of a signal to and from said secondary side circuit, a third lead frame supporting said first semiconductor substrate, and a fourth lead frame for support of the second semiconductor substrate, wherein said device further comprises capacitive insulation means being electrically connected to said primary side circuit and said secondary side circuit and being disposed via a conductive adhesive body between the first and second semiconductor substrates, and wherein said first and second semiconductor substrates, the first to fourth lead frames and said capacitive insulation means are sealed together by a dielectric resin.

(12) The semiconductor device as recited in the paragraph (11), wherein said capacitive insulation means is any one of a multilayered ceramic capacitor and a ceramic capacitor.

(13) The semiconductor device as recited in any one of the preceding paragraphs (1) to (3) and (11), wherein said primary side circuit is on an analog input/output side, wherein said secondary side circuit has an analog front end being on a digital input/output side, wherein said capacitive insulation means permits signal transmission between the analog input/output side circuit and the digital input/output side circuit, and wherein said analog input/output side circuit and said digital input/output side circuit are electrically insulated and isolated from each other.

(14) A modem device comprising an analog front end and modulation/demodulation means, wherein said analog front end is a semiconductor device including a primary side circuit being formed on a first semiconductor substrate and a secondary side circuit as formed on a second semiconductor substrate, wherein signal transmission is done between said primary side circuit and said secondary side circuit via capacitive insulation means.

(15) A semiconductor device comprising a transceiver circuit in a primary side circuit and an application control circuit on a secondary side, wherein said transceiver circuit is formed on or over a first semiconductor substrate whereas said application control circuit is formed on or over a second semiconductor substrate, wherein more than one signal is transmitted via said capacitive insulation means between said transceiver circuit and said application control circuit, and wherein said transceiver circuit and said application control circuit are electrically insulated and isolated from each other.

(16) A communication terminal apparatus for performing communication with a semiconductor device via more than one signal bus line, said apparatus comprising a transceiver circuit, an application control circuit and a host, wherein said transceiver circuit is connected to the signal bus line whereas said application control circuit is connected to the host, and wherein at least said transceiver circuit and said application control circuit are formed inside of the semiconductor device as recited in the paragraph (15).

What is claimed is:

1. A semiconductor device comprising a first semiconductor substrate, a second semiconductor substrate, a primary side circuit being provided on said first semiconductor substrate, a secondary side circuit as provided on said second semiconductor substrate, first capacitive insulation means provided on said first semiconductor substrate for electrically insulating and isolating between said primary side circuit and said secondary side circuit while permitting signal transmission between said primary side circuit and said secondary side circuit, second capacitive insulation means provided on said second semiconductor substrate for electrically isolating between said primary side circuit and said secondary side circuit while permitting signal transmission therebetween, a first lead frame for input and output of a signal to and from said primary side circuit, a second lead frame for signal input and output to and from said secondary side circuits, a third lead frame supporting thereover said first semiconductor substrate, and a fourth lead frame supporting said second semiconductor substrate, wherein an external electrode of said first capacitive insulation means and an external electrode of said second capacitive insulation means are connected together by a bonding wire while letting said first semiconductor substrate and said second semiconductor substrate plus the first to fourth lead frames be sealed by a dielectric resin.

2. The semiconductor device as set forth in claim 1, wherein said first capacitive insulation means is a capacitor comprising a dielectric layer disposed over said first semiconductor substrate and a plurality of electrodes whereas said second capacitive insulation means is a capacitor comprising a dielectric layer disposed over said second semiconductor substrate and a plurality of electrodes.

3. The semiconductor device as set forth in claim 2, wherein said dielectric layer is an interlayer dielectric film.

4. The semiconductor device as set forth in claim 2, wherein at least one of said plurality of electrodes is any one of a metal layer and a polycrystalline silicon layer.

5. The semiconductor device as set forth in claim 2, wherein one of said plurality of electrodes is a diffusion layer as formed at said first and second semiconductor substrates.

6. The semiconductor device as set forth in claim 5, wherein said dielectric layer is an interlayer dielectric film.

7. The semiconductor device as set forth in claim 6, wherein at least one of said plurality of electrodes is any one of a metal layer and a poly-silicon layer.

8. The semiconductor device as set forth in claim 1, wherein element isolation of either one of said first semiconductor substrate and said second semiconductor substrate is PN junction isolation.

* * * * *